United States Patent
Campana

(10) Patent No.: US 7,098,745 B2
(45) Date of Patent: Aug. 29, 2006

(54) SYSTEM TO CONTROL INTEGRATED CIRCUIT RESONANCE

(75) Inventor: Roger D. Campana, Olympia, WA (US)

(73) Assignee: Intel Corporation, Santa Clara, CA (US)

(*) Notice: Subject to any disclaimer, the term of this patent is extended or adjusted under 35 U.S.C. 154(b) by 413 days.

(21) Appl. No.: 10/453,944

(22) Filed: Jun. 4, 2003

(65) Prior Publication Data

US 2004/0245971 A1    Dec. 9, 2004

(51) Int. Cl.
*H03L 7/00* (2006.01)

(52) U.S. Cl. .................. 331/16; 310/316.01; 318/116; 219/662

(58) Field of Classification Search ........... 310/316.01; 318/116; 331/16; 219/662
See application file for complete search history.

(56) References Cited

U.S. PATENT DOCUMENTS

| | | | |
|---|---|---|---|
| 4,811,154 A | 3/1989 | Trenkler et al. | |
| 5,113,116 A * | 5/1992 | Wilson | 310/316.01 |
| 5,774,734 A | 6/1998 | Kikinis et al. | |
| 5,963,023 A | 10/1999 | Herrell et al. | |
| 6,419,159 B1 | 7/2002 | Odinak | |
| 6,484,948 B1 | 11/2002 | Sonoda | |
| 6,608,291 B1 * | 8/2003 | Collins et al. | 219/662 |
| 2004/0076025 A1 | 4/2004 | Gauthier et al. | |

FOREIGN PATENT DOCUMENTS

FR    2 715 869 A1    11/1995
WO   WO 93/22666 A1   11/1993

OTHER PUBLICATIONS

Joseph, R. et al. "Control Techniques to Eliminate Voltage Emergencies in High Performance Processors", Proceedings of The Ninth International Symposium on High-Performance Computer Architecture, HPCA-9 2003, IEEE Computer Society, Los Alamitos, CA, Feb. 8, 2003, pp. 79-90, XP010629503, ISBN: 0-7695-1871-0.

Taylor, G. et al. "An Approach to Measuring Power Supply Impedance of Microprocessors", IEEE Topical Meeting on Electrical Performance of Electronic Packaging, Oct. 29, 2001, pp. 211-214, XP002268928.

McClaning, Kevin "Frequency Shifting of a Complex Signal", © 2001 Kevin McClaning. 8pps.

Umstattd, Ruth "Operating and Evaluating Quadrature Modulators for Personal Communication Systems", AN-899, Oct. 1993, © 1995 National Semiconductor Corporation, 10pps.

* cited by examiner

*Primary Examiner*—Arnold Kinkead
(74) *Attorney, Agent, or Firm*—Buckley, Maschoff & Talwalkar LLC

(57) ABSTRACT

According to some embodiments, a control signal is generated to reduce resonance of a circuit at an operation point, a characteristic of the control signal based on a proximity of an existing operation point to the operation point. Generation of the control signal may include sensing of a current associated with an input voltage signal, generation of a current-based signal based on the sensed current, and generation of the control signal based on a phase difference between the current-based signal and the input voltage signal.

32 Claims, 5 Drawing Sheets

SYSTEM TO CONTROL INTEGRATED CIRCUIT RESONANCE

BACKGROUND

An integrated circuit often requires a constant supply voltage for proper operation. The supply voltage may be delivered by a power delivery circuit. Power transients in the delivery of the supply voltage may, at certain frequencies, cause the integrated circuit and the power delivery circuit to resonate. This resonance may quickly increase the amount of current drawn by the integrated circuit and may thereby cause the supply voltage to dip. As a result, proper operation of the integrated circuit may be compromised.

DETAILED DESCRIPTION

Figure 1:
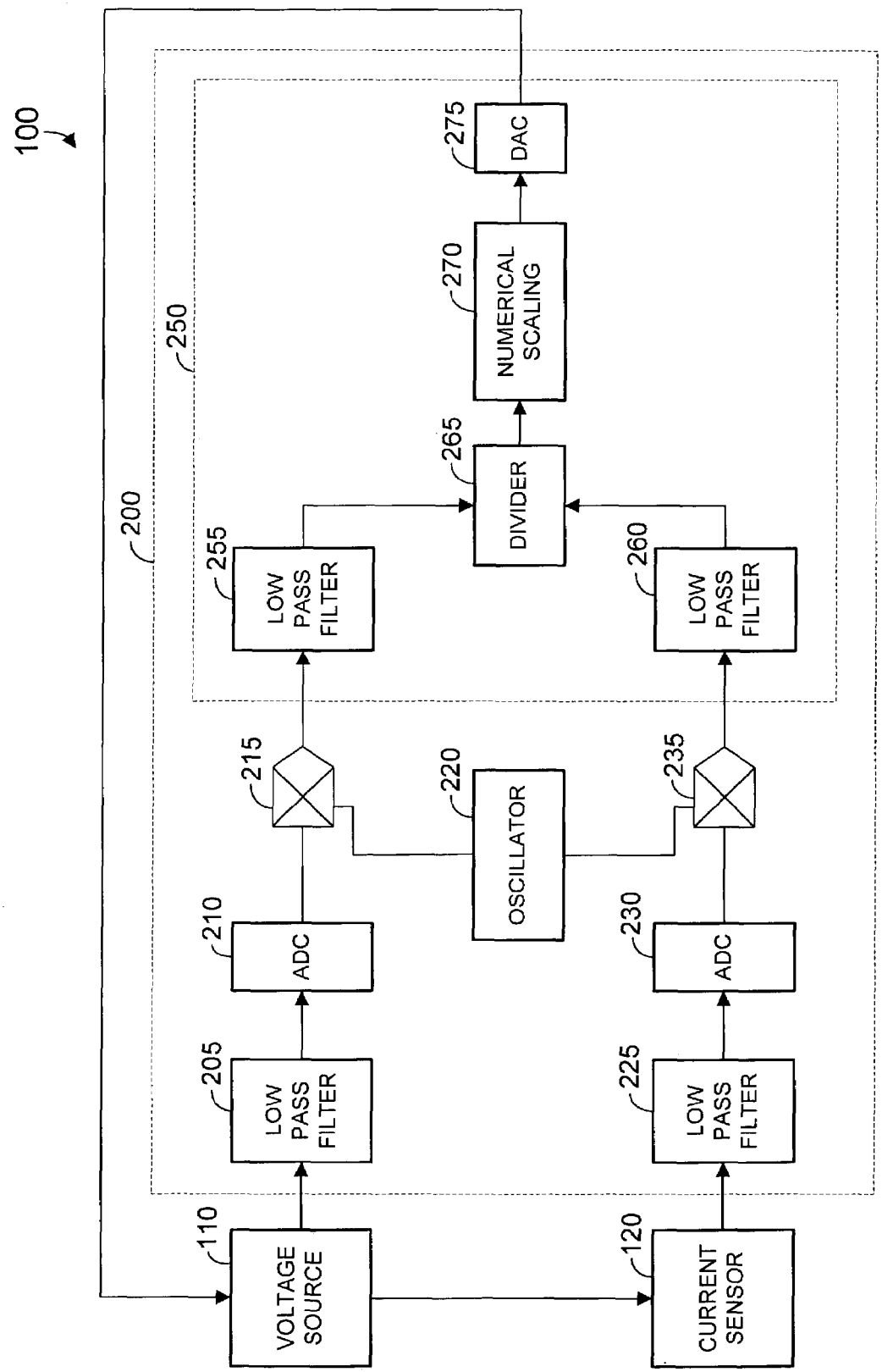
FIG. 1 is a block diagram of a system according to some embodiments.

FIG. 1 is a block diagram of system 100 according to some embodiments. System 100 includes voltage source 110, current sensor 120 and control signal circuit 200. System 100 may be used in some embodiments to generate a control signal to reduce resonance of a circuit at an operation point, wherein a characteristic of the control signal is based on a proximity of an existing operation point of the circuit to the operation point. In this regard, the operation point may be a resonant operation point at which a supply voltage is substantially in phase with a supply current. Moreover, a proximity of an existing operation point to the operation point may be based on a phase difference between the supply voltage and the supply current at the existing operation point.

In one particular example, system 100 senses a current associated with an input voltage signal, generates a current-based voltage signal that is proportional to the sensed current, and generates the control signal based on a phase difference between the current-based voltage signal and the input voltage signal. The control signal may then be used to change a response of a circuit that receives the input voltage signal.

Voltage source 110 of FIG. 1 may comprise a voltage regulator for delivering power to an integrated circuit that includes control signal circuit 200. Voltage source 110 may be physically separate from such an integrated circuit, and may deliver power to electrical elements other than the integrated circuit. The power may be delivered to the integrated circuit, and to control signal circuit 200, in the form of a supply voltage signal. The supply voltage signal may also be delivered to current sensor 120.

Current sensor 120 may receive the supply voltage signal and may generate a signal based thereon. In some embodiments, current sensor 120 senses a current that is associated with the supply voltage signal and generates a voltage signal based on the sensed current. The current-based voltage signal may be proportional to and substantially in phase with the sensed current. Current sensor 120 may reside on and/or within organic microelectronic packaging that packages control signal circuit 200.

Low-pass analog filter 205 of control signal circuit 200 receives the supply voltage signal from voltage source 110. In this regard, the elements of control signal circuit 200 may be integrated into a silicon substrate of an integrated circuit that is powered by the supply voltage signal. Low-pass analog filter 205 may limit a bandwidth of the supply voltage signal and output the bandwidth-limited supply voltage signal to analog-to-digital converter 210. Converter 210 then converts the signal to a digital supply voltage signal. Limiting the bandwidth of the supply voltage signal prior to the conversion may reduce aliasing during the conversion.

Modulator 215 receives the supply voltage signal from converter 210. Modulator 215 also receives a first oscillator signal from oscillator 220 and modulates the supply voltage signal in the digital domain to generate a modulated supply voltage signal. The first oscillator signal may comprise a digital representation of a sinusoidal signal. In some embodiments, a frequency of the sinusoidal signal may range from half the resonant frequency of a microelectronic package that includes circuit 200 to the actual resonant frequency.

Turning to the lower portion of control signal circuit 200, low-pass filter 225 receives the current-based voltage signal from current sensor 120. As described above with respect to low-pass analog filter 205, low-pass analog filter 225 may limit a bandwidth of the current-based voltage signal to reduce aliasing during subsequent analog-to-digital conversion. Accordingly, low-pass analog filter 225 outputs the bandwidth-limited voltage signal to analog-to-digital converter 230, which converts the signal to a digital current-based voltage signal.

Modulator 235 receives the current-based voltage signal from converter 230 and modulates the current-based voltage signal in the digital domain to generate a modulated current-based voltage signal. Modulator 235 modulates the current-based voltage signal based on a second oscillator signal received from oscillator 220. The second oscillator signal may be substantially identical to and −90° out of phase with the above-mentioned first oscillator signal. The second oscillator signal may therefore be described as "in quadrature" with the first oscillator signal.

By virtue of the foregoing arrangement, a phase difference between the supply voltage signal and the current-based signal may be determined based on the modulated supply voltage signal and the modulated current-based voltage signal. The phase difference may indicate a proximity of an existing operation point to a resonant operation point. As mentioned above, a 0° phase difference may indicate that a circuit receiving the supply voltage is operating at a resonant point. The closer the phase difference is to 0°, the closer the existing operation point of the circuit may be to the resonant operation point.

According to some embodiments, the phase difference is inversely proportional to a ratio of an amplitude of the modulated current-based voltage signal to an amplitude of the modulated supply voltage signal. The phase difference may also be substantially equal to an arctangent of the ratio. The phrase "inversely proportional" as used herein merely implies a relationship between a first value and a second value in which an increase in the first value is reflected in a decrease in the second value. Magnitudes of the respective increases may be governed by any relationship, and might not be mathematically related.

Output circuit 250 may generate a control signal based on the modulated voltage signals. The modulated supply voltage signal is filtered by low pass digital filter 255 to filter out high-frequency signal components. In one example, low pass digital filter 255 generates a binary representation of the modulated supply voltage signal in which amplitudes above a threshold value are represented by saturated bit values (e.g., 1111). Low pass digital filter 260 similarly filters the modulated current-based voltage signal output from modulator 235. Divider 265 receives the two signals and outputs a ratio signal having an amplitude that is equal to a ratio of an amplitude of the modulated supply voltage signal to an amplitude of the modulated current-based voltage signal. As mentioned above, this ratio may be inversely proportional to a phase difference between the supply voltage signal and the current-based voltage signal.

Numerical scaling unit 270 may generate a control signal based on the ratio signal output by divider 265. Since the ratio signal indicates a phase difference between the supply voltage signal and the current-based voltage signal, the ratio signal also indicates a proximity of an existing operation point to a resonant operation point. Accordingly, numerical scaling unit 270 may perform any processing on the ratio signal that will result in a suitable control signal in view of the proximity.

According to some embodiments, numerical scaling unit 270 inverts the ratio signal to generate a control signal having an amplitude that is directly proportional to a phase difference between the supply voltage signal and the current-based voltage signal. "Directly proportional" as used herein implies a relationship between a first value and a second value in which an increase in the first value is reflected in an increase in the second value. Such an arrangement may generate a small-amplitude control signal if the phase difference is small and a larger-amplitude control signal in a case that the phase difference is larger. In some embodiments, numerical scaling unit may also or alternatively scale the ratio signal according to a desired range of control signal amplitudes, and/or convert elements of the ratio signal to a desired bit-length.

Digital-to-analog converter 275 converts the digital control signal to an analog control signal. In a case that numerical scaling unit 270 inverts the ratio signal, a magnitude of the analog control signal is small in a case that the amplitude of the ratio signal is large. Moreover, the phase difference is small if the amplitude of the ratio signal is large. Additionally, an existing operation point is proximate to a resonant operation point in a case that the phase difference is small. Consequently, a magnitude of the analog control signal is small in a case that an existing operation point is proximate to a resonant operation point. A magnitude of the control signal is larger in a case that the existing operation point is not proximate to the resonant operation point. As mentioned above, some embodiments result in an analog control signal having a small magnitude in a case that the existing operation point is not proximate to the resonant operation point and a larger magnitude if the existing operation point is proximate to the resonant operation point.

The analog control signal is transmitted back to voltage source 110. Voltage source 110 may change its output impedance based on the control signal so as to reduce a resonant response of voltage source 110 and a package including circuit 200. In this regard, a design of voltage source 10 may determine whether numerical scaling unit 270 inverts, scales, and/or changes a resolution of the ratio signal.

Figure 2:
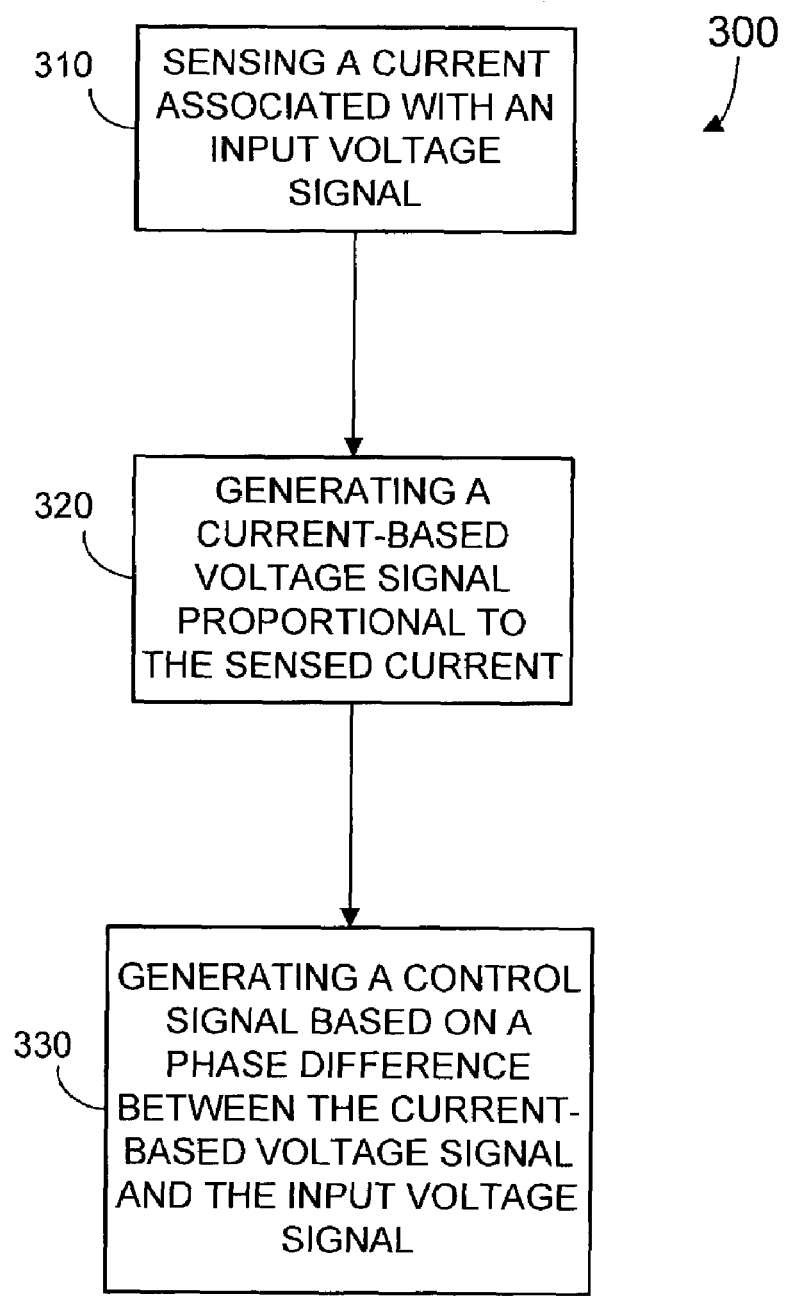
FIG. 2 is a flow diagram of a process according to some embodiments.

FIG. 2 is a flow diagram of process 300 according to some embodiments. However, process 300 may be executed by any combination of hardware, firmware and software.

Initially, at 310, a current associated with an input voltage signal is sensed. The input voltage signal may be a supply voltage signal delivered from a power delivery circuit to an integrated circuit package. The sensed current is a current resulting from the application of the supply voltage signal across a corresponding load. The load may include the integrated circuit package as well as other elements.

A voltage signal is generated at 320 based on the sensed current. The voltage signal is proportional to the sensed current and substantially in phase therewith. Next, at 330, a control signal is generated based on a phase difference between the voltage signal generated at 320 and the input voltage signal. As described with respect to FIG. 1, the control signal may be generated based on a ratio of a modulated current-based voltage signal to a modulated supply voltage signal. The control signal may also be based on an arctangent of the ratio, since the arctangent may be substantially equal to the phase difference.

A phase difference between the supply voltage signal and the current-based signal may indicate a proximity of the existing operation point to a resonant operation point. The control signal that is based on the phase difference may therefore be used to reduce a system response at the resonant operation point. The system response may be reduced by changing an output impedance of the power delivery circuit and/or by changing a self-impedance of the integrated circuit. Other systems for changing the response may also be used in some embodiments.

Figure 3:
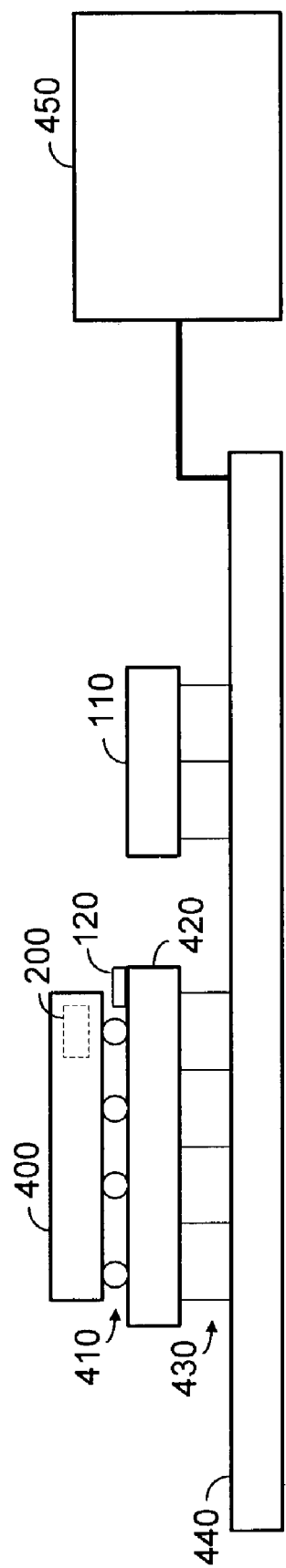
FIG. 3 is a side elevation of a system according to some embodiments.

FIG. 3 is a side elevation of one implementation of system 100 according to some embodiments. The implementation may be incorporated into any number of larger systems, including but not limited to a desktop computer, a server, and a Personal Digital Assistant.

FIG. 3 shows integrated circuit 400 that includes control signal circuit 200. Integrated circuit 400 may comprise a silicon chip on which circuit elements are fabricated using currently- or hereafter-known techniques. Integrated circuit 400 may comprise a microprocessor or any other integrated circuit.

Solder balls 410 mechanically and electrically couple circuit 400 to package 420. Package 420 may comprise any suitable organic, ceramic or other type of circuit package. Current sensor 120 is shown mounted on the surface of package 420. Sensor 120 may be included anywhere within or on package 420. Pins 430 electrically and mechanically couple package 420 to motherboard 440.

Also coupled to motherboard 440 is voltage source 110, which may comprise a voltage regulator. Voltage source 110 provides a supply voltage to package 420 via motherboard 440. As shown in FIG. 1, voltage source 110 may receive a control signal from control signal circuit 200. The control signal is used in some embodiments to vary an output impedance of voltage source 110. Voltage source 110 also receives power from power supply 450, which is in turn coupled to motherboard 440.

Figure 4:
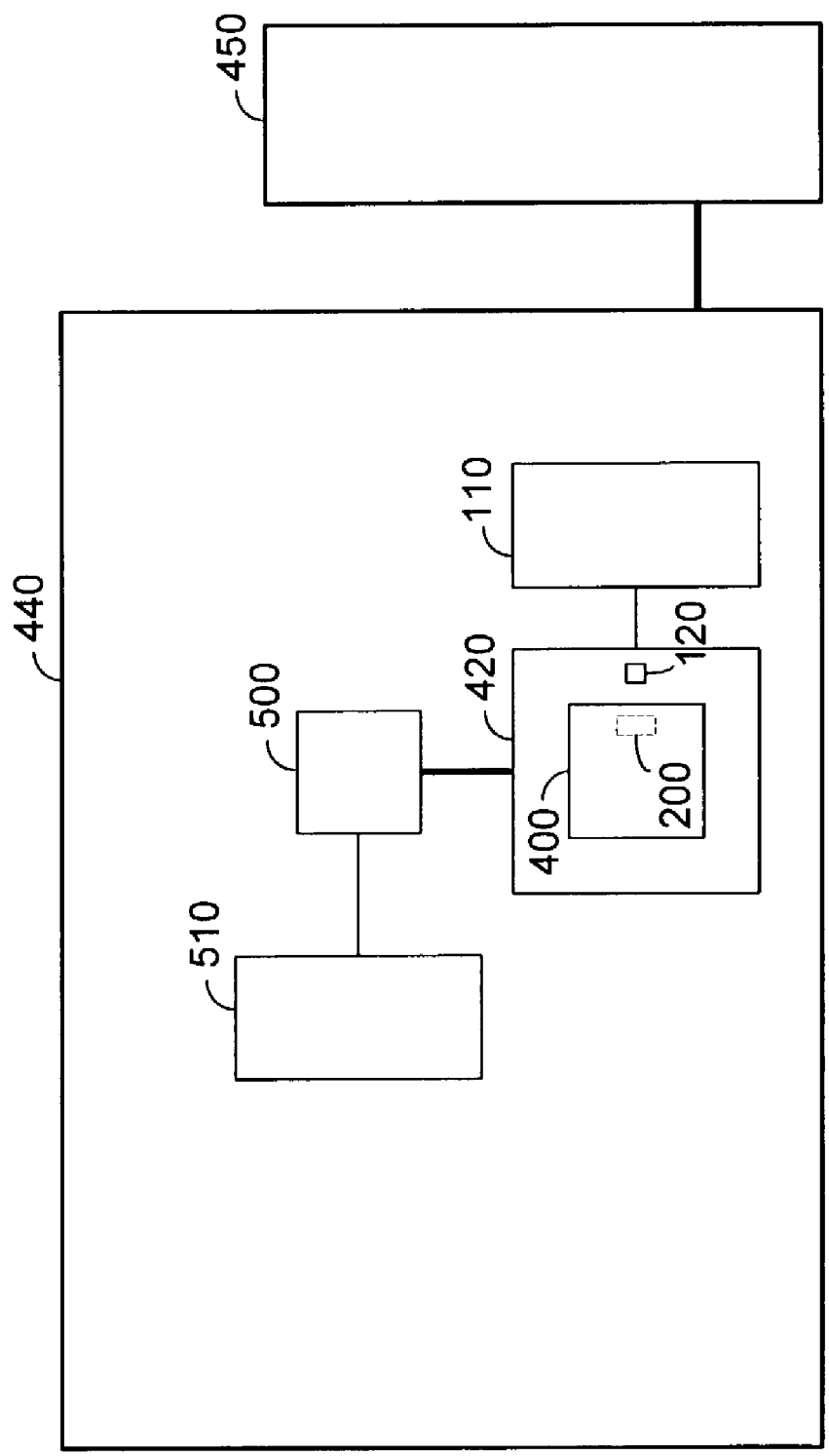
FIG. 4 is a top view of a system according to some embodiments.

FIG. 4 is a top view of the FIG. 3 system according to some embodiments. FIG. 4 shows elements 110, 120, 200, 400, 420, 440 and 450 of FIG. 3 as well as memory controller hub 500 and memory 510. Accordingly, FIG. 4 illustrates an embodiment in which integrated circuit 400 is a microprocessor.

Integrated circuit 400 communicates with memory 510 through memory controller hub 500. Memory 510 may comprise any type of memory for storing data, such as a Single Data Rate Random Access Memory, a Double Data Rate Random Access Memory, or a Programmable Read Only Memory.

Figure 5:
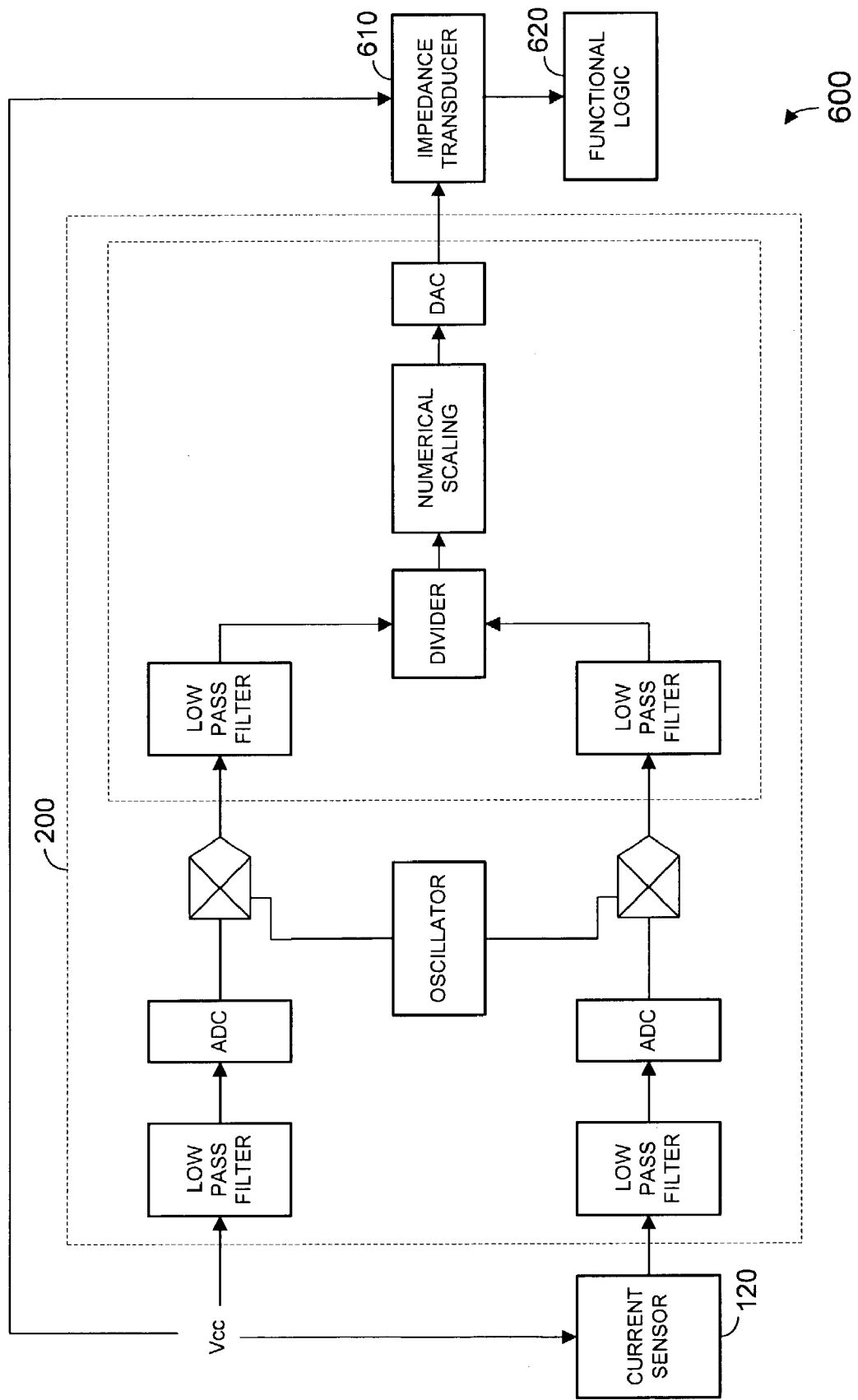
FIG. 5 is a block diagram of a system according to some embodiments.

FIG. 5 is a block diagram of system 600 according to some embodiments. System 600 includes current sensor 120 and control signal circuit 200 of FIG. 1, and also includes impedance transducer 610 and functional logic 620. Impedance transducer 610 and functional logic 620 may be elements of an integrated circuit. The integrated circuit may also include circuit 200.

The control signal generated by circuit 200 may be transmitted to impedance transducer 610. Impedance transducer 610 may change its self-impedance based on the control signal. In some embodiments, impedance transducer 610 may adjust a self-impedance of an integrated circuit including transducer 610 and functional logic 620 based on a proximity of an existing operation point of the integrated circuit to a resonant operation point of the integrated circuit. The adjustment may reduce a response of the integrated circuit at the resonant operation point.

The several embodiments described herein are solely for the purpose of illustration. Embodiments may include any currently or hereafter-known versions of the elements described herein. Therefore, persons skilled in the art will recognize from this description that other embodiments may be practiced with various modifications and alterations.

What is claimed is:

1. A method comprising:
    generating a control signal to reduce resonance of a circuit at an operation point, a characteristic of the control signal based on a proximity of an existing operation point to the operation point, wherein generating the control signal comprises:
        sensing a current associated with an input voltage signal;
        generating a current-based voltage signal, the current-based voltage signal proportional to the sensed current;
        modulating the input voltage signal by a first oscillator signal to generate a modulated voltage signal;
        modulating the current-based voltage signal by a second oscillator signal to generate a modulated current-based voltage signal, the second oscillator signal having a frequency and an amplitude substantially equal to a frequency and amplitude of the first oscillator signal;
        generating a ratio signal based on a ratio of an amplitude of the modulated current-based voltage signal to an amplitude of the modulated voltage signal; and
        generating the control signal based on the ratio signal, a phase difference being inversely proportional to the ratio; and
    controlling an output impedance of a source of the input voltage signal based on the control signal.

2. A method according to claim 1, wherein the second oscillator signal is substantially ninety degrees out of phase with the first oscillator signal.

3. A method according to claim 1, wherein the input voltage signal and the current-based voltage signal are digital signals.

4. A method according to claim 1,
    wherein the phase difference is substantially equal to the arctangent of the ratio.

5. A method according to claim 4, wherein the input voltage signal and the current-based voltage signal are digital signals.

6. A method according to claim 1, further comprising:
    controlling a response curve of the circuit based on the control signal.

7. A method according to claim 6, wherein controlling the response curve comprises:
    controlling a self-impedance of the circuit based on the control signal.

8. A device comprising:
    a sensor to sense a current associated with an input voltage signal and to generate a current-based voltage signal based on the sensed current;
    a control signal circuit to generate a control signal based on the input voltage signal and on the current-based voltage signal, the control signal to reduce resonance of a circuit at an operation point, a characteristic of the control signal based on a proximity of an existing operation point to the operation point, the control signal circuit comprising:
        a first modulator to modulate the input voltage signal with a first oscillator signal and to output a modulated voltage signal;
        a second modulator to modulate the current-based voltage signal with a second oscillator signal and to output a modulated current-based voltage signal, the second oscillator signal having a frequency and an amplitude substantially equal to a frequency and amplitude of the first oscillator signal; and
        an output circuit to generate the control signal based on the modulated voltage signal and on the modulated current-based voltage signal; and
    a voltage regulator to control the input voltage signal based on the control signal.

9. A device according to claim 8, wherein the second oscillator signal is substantially ninety degrees out of phase with the first oscillator signal.

10. A device according to claim 9, the output circuit to generate the control signal based on a phase difference between the input voltage signal and the current-based voltage signal.

11. A device according to claim 10, the output circuit further to generate a ratio signal based on a ratio of an amplitude of the modulated current-based voltage signal to an amplitude of the modulated voltage signal and to generate the control signal based on the ratio signal, wherein the phase difference is inversely proportional to the ratio.

12. A device according to claim 11, wherein the ratio signal is based on an arctangent of the ratio, and wherein the phase difference is substantially equal to the arctangent of the ratio.

13. A device according to claim 8, further comprising:
    a first analog-to-digital converter to output the input voltage signal; and
    a second analog-to-digital converter to output the current-based signal; wherein the output circuit comprises:
    a digital-to-analog converter to output the control signal.

14. A device according to claim 8, the control signal circuit to generate the control signal based on a phase difference between the input voltage signal and the current-based voltage signal.

15. A device according to claim 14, the control signal circuit further comprising:
    a first modulator to modulate the input voltage signal with a first oscillator signal and to output a modulated voltage signal;
    a second modulator to modulate the current-based voltage signal with a second oscillator signal and to output a modulated current-based voltage signal, the second oscillator signal having a frequency and an amplitude substantially equal to a frequency and amplitude of the first oscillator signal; and an output circuit to generate a ratio signal based on a ratio of an amplitude of the modulated current-based signal to an amplitude of the modulated voltage signal, and to generate the control signal based on the ratio signal, wherein the phase difference is inversely proportional to the ratio.

16. A device according to claim 15, wherein the ratio signal is based on an arctangent of the ratio, and wherein the phase difference is substantially equal to the arctangent of the ratio.

17. A device according to claim 8, further comprising:
a control element to control a response curve of the circuit based on the control signal.

18. A device according to claim 17, the control element comprising:
an impedance transducer to control a self-impedance of the circuit based on the control signal.

19. A device according to claim 8, the voltage regulator to control an output impedance of the voltage regulator based on the control signal.

20. A system comprising:
a sensor to sense a current associated with an input voltage signal and to generate a current-based voltage signal based on the sensed current;
an integrated circuit comprising a control signal circuit to generate a control signal based on the input voltage signal and on the current-based voltage signal, the control signal to reduce resonance of a circuit at an operation point, a characteristic of the control signal based on a proximity of an existing operation point to the operation point; and
a double data rate memory in communication with the integrated circuit.

21. A system according to claim 20, wherein the control signal circuit comprises:
a first modulator to modulate the input voltage signal with a first oscillator signal and to output a modulated voltage signal;
a second modulator to modulate the current-based voltage signal with a second oscillator signal and to output a modulated current-based voltage signal, the second oscillator signal having a frequency and an amplitude substantially equal to a frequency and amplitude of the first oscillator signal; and
an output circuit to generate the control signal based on the modulated voltage signal and on the modulated current-based voltage signal.

22. A system according to claim 21, the output circuit to generate the control signal based on a phase difference between the input voltage signal and the current-based voltage signal.

23. A system according to claim 22, the output circuit further to generate a ratio signal based on a ratio of an amplitude of the modulated current-based voltage signal to an amplitude of the modulated voltage signal and to generate the control signal based on the ratio signal, wherein the phase difference is inversely proportional to the ratio.

24. A device according to claim 23, wherein the ratio signal is based on an arctangent of the ratio, and wherein the phase difference is substantially equal to the arctangent of the ratio.

25. A system according to claim 20, further comprising:
a voltage regulator to control the input voltage signal based on the control signal.

26. A system according to claim 25, the voltage regulator to control an output impedance of the voltage regulator based on the control signal.

27. A method comprising:
generating a control signal to reduce resonance of a circuit at an operation point, a characteristic of the control signal based on a proximity of an existing operation point to the operation point, wherein generating the control signal comprises:
sensing a current associated with an input voltage signal;
generating a current-based voltage signal, the current-based voltage signal proportional to the sensed current;
modulating the input voltage signal by a first oscillator signal to generate a modulated voltage signal;
modulating the current-based voltage signal by a second oscillator signal to generate a modulated current-based voltage signal, the second oscillator signal having a frequency and an amplitude substantially equal to a frequency and amplitude of the first oscillator signal;
generating a ratio signal based on a ratio of an amplitude of the modulated current-based voltage signal to an amplitude of the modulated voltage signal; and
generating the control signal based on the ratio signal, a phase difference being inversely proportional to the ratio; and
controlling a self-impedance of the circuit based on the control signal.

28. A method according to claim 27,
wherein the phase difference is substantially equal to the arctangent of the ratio.

29. A device comprising:
a sensor to sense a current associated with an input voltage signal and to generate a current-based voltage signal based on the sensed current;
a control signal circuit to generate a control signal based on the input voltage signal and on the current-based voltage signal, the control signal to reduce resonance of a circuit at an operation point, a characteristic of the control signal based on a proximity of an existing operation point to the operation point, wherein the control signal circuit comprises:
a first modulator to modulate the input voltage signal with a first oscillator signal and to output a modulated voltage signal;
second modulator to modulate the current-based voltage signal with a second oscillator signal and to output a modulated current-based voltage signal, the second oscillator signal having a frequency and an amplitude substantially equal to a frequency and amplitude of the first oscillator signal; and
an output circuit to generate the control signal based on the modulated voltage signal and on the modulated current-based voltage signal; and
an impedance transducer to control a self-impedance of the circuit based on the control signal.

30. A device according to claim 29, wherein the second oscillator signal is substantially ninety degrees out of phase with the first oscillator signal,
wherein the output circuit is to generate the control signal based on a phase difference between the input voltage signal and the current-based voltage signal, and
wherein the output circuit is further to generate a ratio signal based on a ratio of an amplitude of the modulated current-based voltage signal to an amplitude of the modulated voltage signal and to generate the control signal based on the ratio signal, wherein the phase difference is inversely proportional to the ratio.

31. A device according to claim 29, the control signal circuit to generate the control signal based on a phase difference between the input voltage signal and the current-based voltage signal.

32. A device according to claim 31, the control signal circuit further comprising:
- a first modulator to modulate the input voltage signal with a first oscillator signal and to output a modulated voltage signal;
- a second modulator to modulate the current-based voltage signal with a second oscillator signal and to output a modulated current-based voltage signal, the second oscillator signal having a frequency and an amplitude substantially equal to a frequency and amplitude of the first oscillator signal; and
- an output circuit to generate a ratio signal based on a ratio of an amplitude of the modulated current-based signal to an amplitude of the modulated voltage signal, and to generate the control signal based on the ratio signal, wherein the phase difference is inversely proportional to the ratio.

\* \* \* \* \*